United States Patent
Doyle et al.

(10) Patent No.: US 8,965,159 B1
(45) Date of Patent: Feb. 24, 2015

(54) IMPLEMENTING TWISTED PAIR WAVEGUIDE FOR ELECTRONIC SUBSTRATES

(71) Applicant: International Business Machines Corporation, Armonk, NY (US)

(72) Inventors: Matthew S. Doyle, Rochester, MN (US); Joseph Kuczynski, North Port, FL (US); Kevin A. Splittstoesser, Stewartville, MN (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/074,145

(22) Filed: Nov. 7, 2013

(51) Int. Cl.
*G02B 6/44* (2006.01)

(52) U.S. Cl.
CPC .................................. *G02B 6/4401* (2013.01)
USPC ............................... 385/104; 333/1; 333/114

(58) Field of Classification Search
CPC .................................................. G02B 6/4401
USPC ....................................... 385/104; 333/1, 114
See application file for complete search history.

(56) References Cited

U.S. PATENT DOCUMENTS

| | | | |
|---|---|---|---|
| 3,761,842 A * | 9/1973 | Gandrud | 333/1 |
| 4,444,801 A | 4/1984 | Hongo et al. | |
| 5,939,952 A | 8/1999 | Noda et al. | |
| 6,071,676 A | 6/2000 | Thomson et al. | |
| 6,300,846 B1 * | 10/2001 | Brunker | 333/1 |
| 6,774,741 B2 * | 8/2004 | McCurdy et al. | 333/1 |
| 6,807,328 B2 | 10/2004 | Farah | |
| 6,987,428 B2 * | 1/2006 | Marketkar et al. | 333/24 R |
| 7,031,584 B2 | 4/2006 | Lee et al. | |
| 7,391,947 B1 | 6/2008 | Bado et al. | |
| 8,270,788 B2 | 9/2012 | Herman et al. | |
| 8,420,301 B2 | 4/2013 | Ho et al. | |
| 8,528,203 B2 | 9/2013 | Balcome et al. | |
| 2010/0136489 A1 | 6/2010 | Tai et al. | |

FOREIGN PATENT DOCUMENTS

| | | |
|---|---|---|
| EP | 0340997 B1 | 8/1989 |
| GB | 2488575 A | 5/2012 |
| WO | WO2006012057 A1 | 2/2006 |

OTHER PUBLICATIONS

Laser Micro-Fabrication of Waveguide Devices—IPCOM000034732D, Jan. 27, 2005.

* cited by examiner

*Primary Examiner* — Ellen Kim
(74) *Attorney, Agent, or Firm* — Joan Pennington

(57) ABSTRACT

A method and structures are provided for implementing an impedance-matched, low inductance, 3-dimensional (3D) twisted-pair within a given dielectric material layer. A dielectric material layer is loaded with an electrically insulating metal spinel compound at a set loading level. Upon exposure to a focused laser beam, the spinel is converted to a metallic particle with an electrical conductivity suitable for various applications. An impedance-matched, low inductance, 3-dimensional (3D) twisted-pair is generated using a laser direct structuring process with a fine depth control achieved with a laser.

9 Claims, 3 Drawing Sheets

200

```
┌─────────────────────────────────────────────────────────────┐
│ PROVIDE A GIVEN DIELECTRIC MATERIAL LAYER WITHIN PCB, FLEX OR│
│     OTHER ELECTRONIC PACKAGING DIELECTRIC LAYER.            │
│                          202                                │
└─────────────────────────────────────────────────────────────┘
                              │
┌─────────────────────────────────────────────────────────────┐
│   LOAD THE DIELECTRIC MATERIAL LAYER WITH AN ELECTRICALLY   │
│  INSULATING METAL SPINEL COMPOUND (AT SET LOADING LEVEL) TO BE│
│           USED FOR GENERATING TWISTED PAIR                  │
│                          204                                │
└─────────────────────────────────────────────────────────────┘
                              │
┌─────────────────────────────────────────────────────────────┐
│ GENERATE EMBEDDED TWISTED PAIRS USING LASER DIRECT STRUCTURING│
│ BY RASTERING THE LASER IN THE XY PLANE AND CONTROLLING THE FOCAL│
│  DEPT IN Z-AXIS. AT THE LASER FOCAL POINT, SPINEL CONVERTED INTO│
│ METAL (E.G., COPPER) AND AN INSULATING DIELECTRIC LEFT BETWEEN THE│
│      CU TRACES, GENERATING THE EMBEDDED TWISTED PAIRS.      │
│                          206                                │
└─────────────────────────────────────────────────────────────┘
```

FIG. 2 ated with a laser.# IMPLEMENTING TWISTED PAIR WAVEGUIDE FOR ELECTRONIC SUBSTRATES

FIELD OF THE INVENTION

The present invention relates generally to the data processing field, and more particularly, relates to a method and structures for implementing an impedance-matched, low inductance, 3-dimensional (3D) twisted-pair waveguide within a printed circuit board dielectric material layer of electronic packaging.

DESCRIPTION OF THE RELATED ART

As used in the present specification and claims, the terms circuit board, printed circuit board or PCB means a substrate or multiple layers (multi-layer) of substrates used for electronic packaging, for example, to electrically attach electrical components and should be understood to generally include circuit cards, printed circuit cards, backplanes, printed wiring cards, printed wiring boards, flex circuits, and ceramic or organic chip packaging substrates.

Existing solutions attempt to create twisted-pair constructs within PCBs or electronic packaging materials, yet do not achieve desired impedance-matched, low inductance, 3-D twisted-pair structures. For example, U.S. Pat. No. 5,939,952 issued Aug. 17, 1999 to Noda et al., entitled "FLAT FLEXIBLE CABLE WITH PSEUDO-TWISTED CONDUCTORS" discloses a flat flexible electrical cable which includes a pair of pseudo-twisted conductors on a flexible dielectric substrate. Each conductor includes alternate straight and oblique sections. The straight sections of the conductors are generally parallel to each other and of uniform width. The oblique sections of the conductors cross each other at a crossover point. Each oblique section of each conductor is reduced in width uniformly in a direction from the straight-to-oblique transfer point of the respective conductor to the crossover point of the conductors.

A need exists for an efficient and effective method for manufacturing a 3-dimensional (3D) twisted-pair of conductors within a given dielectric material layer, such as a given dielectric material layer in a printed circuit board (PCB), flex circuit or other electronic packaging dielectric layer. It is desirable to create impedance-matched, low inductance, 3-dimensional (3D) twisted-pair waveguides within a given printed circuit dielectric material layer.

SUMMARY OF THE INVENTION

Principal aspects of the present invention are to provide a method and structures for implementing an impedance-matched, low inductance, 3-dimensional (3D) twisted-pair waveguide within a given dielectric material layer. Other important aspects of the present invention are to provide such method and structures substantially without negative effects and that overcome many of the disadvantages of prior art arrangements.

In brief, a method and structures are provided for implementing impedance-matched, low inductance, 3-dimensional (3D) twisted-pairs within a given dielectric material layer. A dielectric material layer is loaded with an electrically insulating metal spinel compound at a set loading level. Upon exposure to a focused laser beam, the spinel is converted to a metallic particle with an electrical conductivity suitable for various applications. An impedance-matched, low inductance, 3-dimensional (3D) twisted-pair is generated using a laser direct structuring process with available fine depth control achieved with a laser.

In accordance with features of the invention, converting the spinel to a metallic particle with a set electrical conductivity includes generating an impedance-matched, low inductance, 3-dimensional twisted-pair waveguide.

In accordance with features of the invention, a laser direct structuring process exposing the electrically insulating metal spinel compound to a focused laser beam includes rastering the laser beam in an xy plane and controlling the focal depth in a z axis.

BRIEF DESCRIPTION OF THE DRAWINGS

The present invention together with the above and other objects and advantages may best be understood from the following detailed description of the preferred embodiments of the invention illustrated in the drawings, wherein:

FIG. 2 is a flow chart illustrating exemplary steps for implementing an impedance-matched, low inductance, 3-dimensional (3D) twisted-pair waveguide within a dielectric material layer in accordance with the preferred embodiment.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and structures are provided for implementing an impedance-matched, low inductance, 3-dimensional (3D) twisted-pair waveguide within a given dielectric material layer. An impedance-matched, low inductance, 3-dimensional (3D) twisted-pair waveguide is generated using a laser direct structuring process with a fine depth control achieved with a laser. A dielectric material layer is loaded with an electrically insulating metal spinel compound at a set loading level to be empirically determined. Upon exposure to a focused laser beam, the spinel is converted to a metallic particle with an electrical conductivity suitable for various applications.

Figure 1:
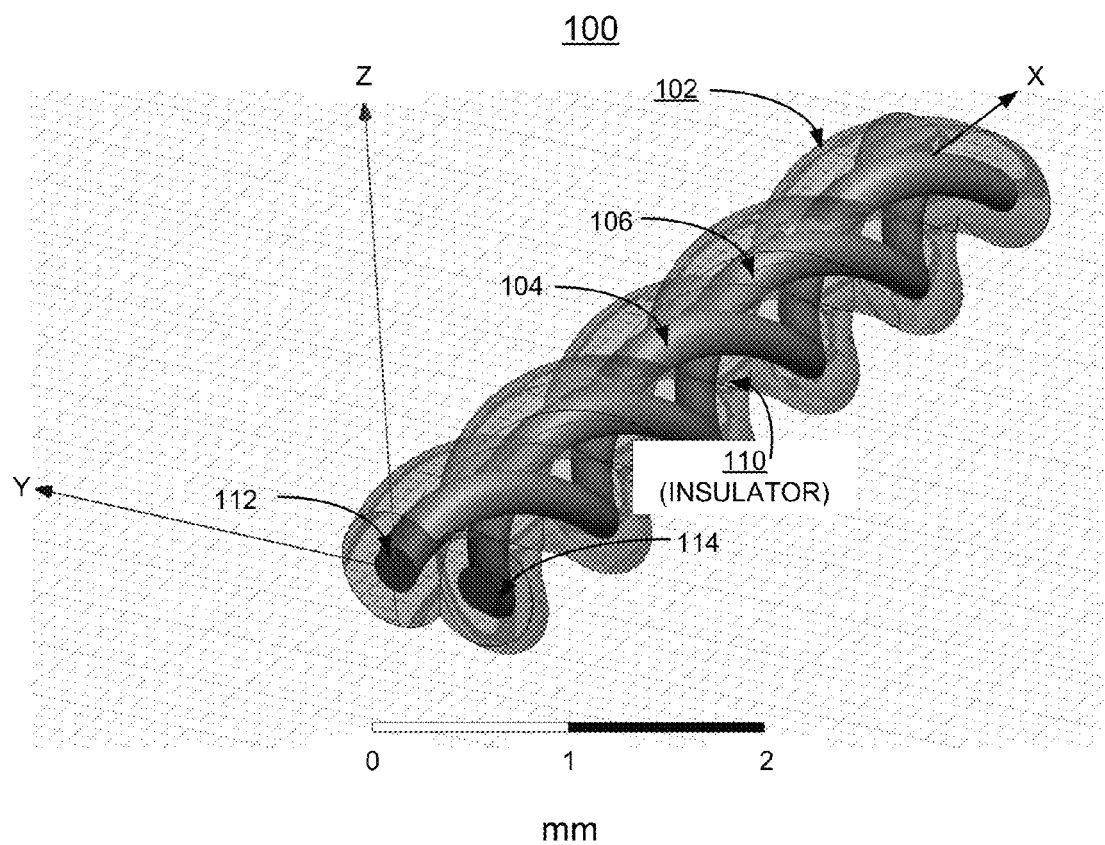
FIG. 1 illustrates an example structure for implementing an impedance-matched, low inductance, 3-dimensional (3D) twisted-pair waveguide within a dielectric material layer in accordance with the preferred embodiment.

Having reference now to the drawings, in FIG. 1, there is shown an example structure for implementing an impedance-matched, low inductance, 3-dimensional (3D) twisted-pair or twisted-conductor pair generally designated by the reference character 100 within a dielectric material layer generally designated by the reference character 102 in accordance with preferred embodiments. The embedded impedance-matched, low inductance, 3-dimensional (3D) twisted-pair structure 100 provides, for example, an embedded 3D waveguide without disturbing signal wave propagation within the same dielectric material layer 102.

The twisted-pair structure 100 is formed in the given dielectric material layer 102, such as a substrate used for electronic packaging, for example, circuit cards, printed circuit cards, backplanes, printed wiring cards, printed wiring boards, flex circuits, and ceramic or organic chip packaging substrates. The twisted-pair structure 100 includes a twisted-pair of a first conductor 104 and a second conductor 106 with an electrical insulator or an insulating dielectric 110 left between the conductors or traces 104, 106 when generating embedded twisted pair structure. The conductors or traces 104, 106 shown relative to an XY plane and a Z axis include respective conductor ends 112 and 114, as shown.

In accordance with features of the invention, the embedded twisted-pair structure 100 is created using a laser direct structuring process modified to take advantage of the fine depth control that can be achieved with a laser, so that a true twisted pair 100 can be generated within a dielectric material 102.

Referring also to FIG. 2 there is shown a flow chart illustrating exemplary steps for implementing an impedance-matched, low inductance, 3-dimensional (3D) twisted-pair waveguide within a dielectric material layer in accordance with the preferred embodiment.

As indicated at a block 202, a given dielectric material layer is provided within a printed circuit board (PCB), flex or other electronic packaging dielectric layer.

In accordance with features of the invention, the dielectric material layer is loaded with an electrically insulating metal spinel compound at a set loading level to be used for generating the twisted pair, as indicated in a block 204. For example, the electrically insulating metal spinel compound can be provided by a copper-containing spinel PK 3095 made by Ferro GmbH of Ferro Corporation, Mayfield Heights, Ohio 44124, USA.

As indicated in a block 206, embedded twisted pairs in the given dielectric material layer are generated using laser direct structuring. At block 206, the twisted pairs 100 advantageously are generated by rastering the laser in the XY plane and controlling the focal depth in the Z axis. At the laser focal point, the spinel in the electrically insulating metal spinel compound is converted into metal, such as copper (Cu) defining the twisted-pair of conductors 104, 106, as shown in FIG. 1. With the spatial resolution capable with the laser, the insulating dielectric 110 advantageously is left between the Cu traces or twisted-pair of conductors 104, 106 thereby generating embedded twisted pair structure 100 in accordance with the preferred embodiment.

Figure 3:
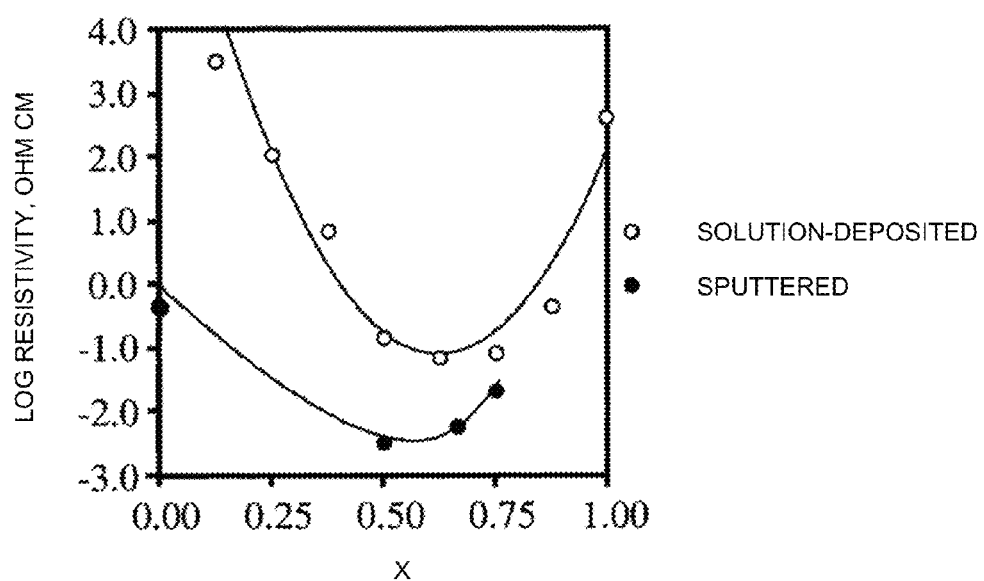
FIG. 3 is a chart illustrating log resistivity for solution deposited and sputtered conducting spinel oxide films in accordance with a preferred embodiment.

Referring also to FIG. 3, there is shown a chart illustrating conductivity values for solution-deposited and sputtered conducting spinel oxide films approaching almost metallic behavior in the case of the sputter deposited films provided in a publication entitled "Conducting spinel oxide films with infrared transparency" by Charles F. Windisch Jr., Kim F. Ferris, Gregory J. Exarhos, and, Shiv K. Sharma, Thin Solid Films 420-421 (2002) 89-99.

It should be understood that the present invention is not limited to use of the example electrically insulating metal spinel compound, other compounds may be chosen by those skilled in the art.

While the present invention has been described with reference to the details of the embodiments of the invention shown in the drawing, these details are not intended to limit the scope of the invention as claimed in the appended claims.

What is claimed is:

1. A method for implementing a twisted-pair structure within a given dielectric material layer comprising:
   providing a dielectric material layer within an electronic packaging;
   loading the dielectric material layer with an electrically insulating metal spinel compound at a set loading level; and
   using a laser direct structuring process exposing the electrically insulating metal spinel compound to a focused laser beam, converting the spinel to a metallic particle with a set electrical conductivity for generating a twisted-conductor pair structure.

2. The method as recited in claim 1 wherein using a laser direct structuring process exposing the electrically insulating metal spinel compound to a focused laser beam, converting spinel to a metallic particle with a set electrical conductivity for generating a twisted-conductor pair structure includes providing an insulating dielectric between the twisted-conductor pair.

3. The method as recited in claim 1 wherein using a laser direct structuring process exposing the electrically insulating metal spinel compound to a focused laser beam includes rastering the laser beam in an xy plane and controlling the focal depth in a z axis.

4. The method as recited in claim 1 wherein using a laser direct structuring process exposing the electrically insulating metal spinel compound to a focused laser beam includes converting the spinel to a metal.

5. The method as recited in claim 4 wherein the metal includes copper.

6. The method as recited in claim 1 wherein converting the spinel to a metallic particle with a set electrical conductivity for generating a twisted-conductor pair structure includes generating an impedance-matched, twisted-conductor pair structure, 3-dimensional (3D) twisted-pair waveguide.

7. The method as recited in claim 1 wherein converting the spinel to a metallic particle with a set electrical conductivity for generating a twisted-conductor pair structure includes generating a low inductance, twisted-conductor pair structure.

8. The method as recited in claim 1 wherein converting the spinel to a metallic particle with a set electrical conductivity for generating a twisted-conductor pair structure includes generating an embedded twisted-conductor pair waveguide.

9. The method as recited in claim 1 wherein converting the spinel to a metallic particle with a set electrical conductivity for generating a twisted-conductor pair structure includes generating an impedance-matched, low inductance, 3-dimensional twisted-pair waveguide.

* * * * *